(12) United States Patent
Viktorovich et al.

(10) Patent No.: US 10,619,459 B2
(45) Date of Patent: Apr. 14, 2020

(54) DOWNHOLE ACOUSTIC EMITTER

(71) Applicants: FEDERALNOE GOSUDARSTVENNOE BUDZHETNOE UCHREZHDENIE NAUKI INST FIZIKI METALLOV IMENI M N MIKHEEVA URA, Ekaterinburg (RU); OBSCHESTVO S OGRANICHENNOI OTVETSTVENNOSTIU NPO PROMRESURS OOO NPO PROMRESURS, Ekaterinburg (RU); SERVICIOS Y SUMINISTROS WEAVER DE MEXICO SA DE CV, Campeche CP (MX)

(72) Inventors: Tarakanov Valeriy Viktorovich, Ekaterinburg (RU); Kuznettsov Mikhail Innokentyevich, Ekaterinburg (RU); Patserkovsky Roman Petrovich, Sverdlovskaya obl. (RU)

(73) Assignees: FEDERALNOE GOSUDARSTVENNOE BUDZHETNOE UCHREZHDENIE NAUKI INSTITUT METALLOV IMENI M.N. Mikheev (RU); OBSCHESTVO S OGRANIC HENNOI OVTETSTVENNOSTIU NPO PROMRESORS (RU); SERVICIOS Y SUMINISTROS WEAVER DE MEXICO SA DE CV (MX)

( * ) Notice: Subject to any disclaimer, the term of this patent is extended or adjusted under 35 U.S.C. 154(b) by 0 days.

(21) Appl. No.: 16/314,233

(22) PCT Filed: May 11, 2017

(86) PCT No.: PCT/RU2017/000301
§ 371 (c)(1),
(2) Date: Dec. 28, 2018

(87) PCT Pub. No.: WO2018/038635
PCT Pub. Date: Mar. 1, 2018

(65) Prior Publication Data
US 2019/0226302 A1    Jul. 25, 2019

(30) Foreign Application Priority Data

Aug. 23, 2016   (RU) ............................... 2016134572

(51) Int. Cl.
*E21B 43/00*   (2006.01)
*B06B 1/08*   (2006.01)
(Continued)

(52) U.S. Cl.
CPC .............. *E21B 43/003* (2013.01); *B06B 1/08* (2013.01); *E21B 28/00* (2013.01); *E21B 43/25* (2013.01); *H01L 41/20* (2013.01); *B06B 2201/73* (2013.01)

(58) Field of Classification Search
CPC ......... H01L 41/20; B06B 1/08; E21B 43/003; E21B 28/00; E21B 47/14; E21B 47/16
(Continued)

(56) References Cited

U.S. PATENT DOCUMENTS 6,429,575 B1 *   8/2002   Abramov .................. B06B 3/00
310/337

FOREIGN PATENT DOCUMENTS

RU   2196217 C2 *   1/2003
RU   2196217 C2       1/2003
(Continued)

*Primary Examiner* — Giovanna C Wright
*Assistant Examiner* — Dany E Akakpo
(74) *Attorney, Agent, or Firm* — Welsh Flaxman & Gitler LLC

(57) ABSTRACT

A downhole acoustic emitter including a support housing with a cavity and ports, in which housing are disposed a
(Continued)

rod-type magnetostrictive transducer with an electrical coil on the rods, and an acoustic waveguide in the form of a cylinder which transitions into a tapering cone. The cylindrical portion of the acoustic waveguide is disposed inside the support housing, and the conical portion is disposed outside the housing. The upper end surface of the acoustic waveguide is coaxially joined to the lower emitting surface of the magnetostrictive transducer by soldering, and the acoustic waveguide is joined at its middle portion, which coincides with the zero vibration point of the waveguide, to the support housing by a threaded joint. The downhole acoustic emitter is provided with an emitting element, the upper end of which is coaxially joined to the lower end of the acoustic waveguide by a threaded joint. The magnetostrictive transducer has a length of 200-280 mm and is made of Permendur, and the ports are arranged around the perimeter of the support housing in two rows, the first of which is level with the top turns of the electrical coil of the magnetostrictive transducer, and the second row is level with the bottom turns of the coil. The emitting element is in the form of a cylinder or a prism with a square cross-section.

5 Claims, 1 Drawing Sheet

(51) Int. Cl.
 *E21B 28/00* (2006.01)
 *E21B 43/25* (2006.01)
 *H01L 41/20* (2006.01)
(58) Field of Classification Search
 USPC .......................................................... 367/82
 See application file for complete search history.

(56) References Cited

FOREIGN PATENT DOCUMENTS

| RU | 2248850 | 3/2005 |
| RU | 2312980 C1 | 12/2007 |

\* cited by examiner

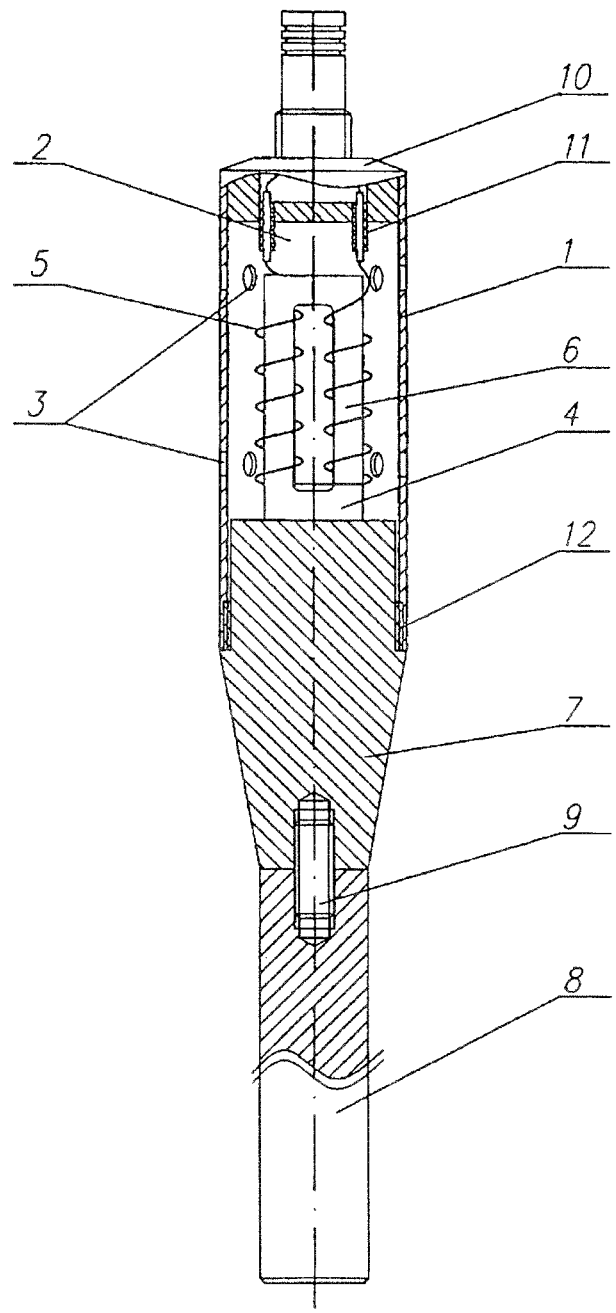

DOWNHOLE ACOUSTIC EMITTER

BACKGROUND OF THE INVENTION

1. Field of the Invention

The invention relates to the oil industry and is intended to impact on the bottom zone of oil wells.

2. Description of the Related Art

Work on the application of acoustic effects on productive formations of oil wells and injection wells has been conducted since 1986, and several structures are currently known that create such an impact. In the course of these works, it was shown that the enhanced oil recovery of the fields directly depends on the increase in the effective radius of the downhole acoustic emitter on the bottom hole zone of the oil wells.

Currently known designs of downhole emitters use operating frequencies of 20-30 Hz, which implies a fairly rapid attenuation of the acoustic wave in the near-well space. The supply of high-frequency power to the indicated emitters from the ground generator via a connecting geophysical cable leads to the use of these frequencies in the cable 50% of the energy for high-frequency heating, and, consequently, a sharp drop in system efficiency. The diameter of modern oil producing wells allows positioning of the active elements of the emitters only along the axis of the well, and, therefore, the radiation from the end surfaces of the emitters, which have a small area, is directed in the axial direction, which also reduces the effectiveness of acoustic effects.

A device for acoustic impact on productive formations of oil wells is known from Russian Federation Patent No. 2,026,970. The device is composed of a ground indicator unit and a power supply unit connected via a cable to a downhole tool. The device includes a generator and an acoustic emitter made in the form of several rod magnetostrictive transducers. The downhole tool is made in three-sections and a coupling locator and a converter are inserted in it. An acoustic radiator is placed in the lower section filled with transformer oil not more than 75% of the volume under atmospheric pressure. A generator is installed, and in the upper section there is a coupling locator, a transducer and a system sensor.

A disadvantage of this device is that the radiation from the end surfaces of the radiator occurs in the axial direction, and is also shielded by the housing. The surface, radiating acoustic energy, has a small area. As a result, this device has a small radius of effective impact on the bottomhole zone. In addition, the use of a pressure compensator in the design of a bellows, reduces the reliability of the device, since a direct impact on the bellows of the acoustic field can damage the bellows mount and damage it.

There is also a downhole thermoacoustic device (downhole acoustic emitter) disclosed in Russian Federation Patent No. 2,161,244. The downhole thermoacoustic device is composed of a support housing consisting of an open part in contact with a well fluid through windows made in the support housing and a sealed part filled with insulating fluid and having an air cavity, under atmospheric pressure. In the supporting case there is an acoustic reflector and a rod magnetostrictive transducer, which is rigidly fixed in the supporting case of the acoustic reflector. The upper radiating surface of the magnetostrictive transducer interacts with the air cavity, and the distance between the reflecting surface of the acoustic reflector and the radiating end of the magnetostrictive transducer is equal to an odd number of half-waves established in the borehole fluid at the resonant frequency of the magnetostrictive transducer. The windows made in the open part of the reference cases are located between the radiating end of the magnetostrictive transducer and the reflective surface of the acoustic reflector.

In addition, an additional housing is pressed on the rods of the magnetostrictive transducer, and the hermetic part of the supporting housing is formed by pouring the internal cavity of the magnetostrictive transducer with a heat-resistant epoxy compound, which after solidification turns into a monolith with the entire system.

A disadvantage of this device is that the radiating surface also has a small area and works in the axial direction, which reduces the radius of the effective impact of the downhole acoustic emitter on the bottomhole zone. Another disadvantage of this device is the presence of an additional body pressed on the rod of a magnetostrictive transducer, as well as the filling of the magnetostrictive transducer with a heat-resistant epoxy compound, which leads to mechanical stresses of the device elements, a decrease in the oscillation amplitude of the radiating end of the magnetostrictive transducer and deterioration of heat transfer, which reduces the efficiency and efficiency of the device bottomhole zone. In addition, due to the difference in thermal expansion coefficients of the material from which the rods of the magnetostrictive transducer and support housing are made, at high temperature and pressure differences in the wells these elements can be broken, which will cause the device to fail and be unreliable in operation.

Another known device is a downhole acoustic emitter, disclosed in Russian Federation Patent No. 2,196,217. The downhole acoustic emitter includes a support housing consisting of an open part in contact with the well fluid through a window made in the open part of the support housing, and a sealed part filled with insulating fluid and having an air cavity located under atmospheric pressure. A rod magnetostrictive transducer is located in the support housing, the upper part of which interacts with the air cavity. An acoustic waveguide is additionally located in the support housing, which is connected to the magnetostrictive transducer by soldering, and also, in its middle part, coinciding with the zero point of oscillation, rigidly and hermetically, by means of a weld, is connected to the support housing, dividing it into open and hermetic parts; the lower end surface of the acoustic waveguide is located in the open part of the support housing. A disadvantage of this device is that the device emits energy in the axial direction from the end of the waveguide, which has a small area, which determines the low acoustic power of the device, and, consequently, a small radius of the effective action of the downhole acoustic emitter on the bottomhole zone. Another disadvantage of this device is the rigid and tight connection of the acoustic waveguide with a support housing by means of a weld, which makes the structure practically non-repairable when the winding of the magnetostrictive transform fails housing.

SUMMARY OF THE INVENTION

The goal of the invention is to increase the radius of the effective impact of the downhole acoustic emitter on the bottomhole zone of oil wells by increasing the acoustic power, the radial direction of acoustic radiation, and reducing the kilometric attenuation of the acoustic wave in the surrounding space while increasing reliability and maintainability.

The goal is achieved by providing a downhole acoustic emitter composed of a support housing with a cavity and windows. A rod magnetostrictive transducer with electric winding on its rods and an acoustic waveguide are located within the support housing. The upper end surface of the acoustic waveguide is coaxially connected to the lower radiating surface of the magnetostrictive transducer by soldering. This acoustic waveguide in its middle part, which coincides with the zero point of its oscillation, is hermetically connected to the support body housing by a threaded connection along the perimeter thereof. According to the invention, the upper end of the magnetostrictive transducer is located in the cavity and is provided with a radiating element. The acoustic waveguide is made in the form of a cylinder, which passes into a decreasing cone. The cylindrical part of the acoustic waveguide is located in the support housing, and the conical is outside the support housing and the upper end of the radiating element is connected coaxially with the lower end of the acoustic waveguide by a threaded connection. The magnetostrictive transducer is 200-280 mm long and is made of a Permendur. Located on the perimeter of the support housing are two rows of windows, the first of which is at the level of the upper electrical windings magnetostrictive transducer, and the second of which is on the lower level of its turns.

Wherein:
the connection of the support housing with the acoustic waveguide is made in the form of a threaded connection; and
the radiating element is made in the form of a cylinder or a prism with a square cross section.

Forming the lower part of the acoustic waveguide in the form of a hub cone, allows one to increase the oscillation amplitude of its end connected to the radiating element introduced into the downhole acoustic radiator, and, accordingly, allows one to increase the oscillation amplitude of the radiating element and the acoustic wave radiation area, which increases the acoustic power of the downhole acoustic radiator and thereby increases the radius of its effective impact on the bottomhole zone. An acoustic wave transmitted from the acoustic waveguide to the radiating element excites in it natural oscillations directed normally to the surface of the radiating element, that is, radially to the borehole, which allows a sharp increase in the radiating surface, and, therefore, also increases the radius of its effective action on bottomhole zone.

The implementation of a magnetostrictive transducer with a length of 200-280 mm allows one to obtain an operating frequency of 8-12 kHz, which makes it impossible to achieve an effective impact radius on the near-well space of 8-10 m by increasing the amplitude of oscillations of the magnetostrictive transducer, and, consequently, the acoustic power, which is less than kilometric attenuation waves in the environment, as well as significantly reduce energy loss in the connecting cable. The performance of a magnetostrictive transducer with a length of more than 280 mm can lead to the appearance of flexural vibrations in a magnetostrictive transducer and the emitter failure. Preforming a magnetostrictive transducer with a length of less than 200 mm will lead to an increase in the operating frequency above 12 kHz, which will reduce the amplitude of oscillations, increase cable losses and increase the kilometric attenuation of the acoustic wave in the near-well space, which, accordingly, will reduce the impact efficiency. The implementation of the support housing is completely open due to two rows of windows located at the level of the upper and lower turns of the winding of the magnetostrictive transducer, respectively allows for efficient heat removal from the magnetostrictive transducer.

The arrangement of the windows around the perimeter of the support housing in two rows, the first of which is at the level of the upper turns of the electric winding of the magnetic converter, and the second at the level of its lower turns, ensures the cavity is filled due to the known effect of outgassing liquids in the acoustic gas released by oil in turn, provides full reflection of oscillations from the upper radiating surface of the magnetostrictive transducer and, thanks to good acoustic contact with conical waveguide provides a doubling of the amplitude of the lower end face of the waveguide oscillations, which increases the acoustic power of the lower end face of the waveguide oscillations, which increases the acoustic power of the downhole acoustic radiator and thereby increasing the radius of its effective impact on the bottomhole zone.

Forming a radiating element of a borehole acoustic radiator in the form of a cylinder or a prism with a square cross section provides the greatest acoustic radiation power, which is confirmed by a series of experiments conducted by the authors at the laboratory of carbon nanomaterials of the Federal State Budgetary Institution of Science named after M. N. Mikheev of the Ural Branch of the Russian Academy of Sciences. In the course of the experiments, the effectiveness of the acoustic effects of interchangeable radiating elements of various shapes, namely: a cylinder, a cylinder with a variable diameter, a cone, a cone of three concentrating cones, a fungal-shaped radiator, a square prism, was investigated.

Efficiency was assessed by the loss of dry weight of aluminum foil 0.01 mm thick, 255 mm-950 mm thick, under the influence of acoustic radiation, imitating the destruction of deposits deposited in cracks and pores of rocks that form near-well space. The radiating element was placed in the center of a lattice cylindrical conductor with a diameter of 200 mm and a length of 900 mm, over the entire surface of which the above-mentioned foil was located. The acoustic impact on the foil was carried out for 30 s, using the same magnetostrictive transducers and the UZG2 feed generator.

The electric power of the generator in all cases was set the same, at 2.5 kW. The results of the experiments are given in the table.

TABLE

| Shape of radiant element | The weight of the foil before the influence, gr. | The weight of the foil after influence, gr. | Weight loss, % |
|---|---|---|---|
| Cylinder | 6.10 | 2.93 | 52 |
| Cylinder with variable along the length of the diameter | 6.10 | 5.18 | 15 |
| Cone | 6.12 | 5.63 | 8 |
| Cone of three cones of the hub | 6.10 | 5.08 | 17 |
| Mushroom shaped emitter | 6.11 | 5.51 | 10 |
| Prism with a square cross-section | 6.10 | 3.30 | 46 |

As can be seen from the table, the maximum weight loss foil occurs when the emitters are cylindrical and prismatic.

The connection of the reference housing with the acoustic waveguide by means of a threaded connection increases the maintainability of the borehole acoustic waveguide by means of a threaded connection increases the maintainability of the borehole acoustic emitter in case of its damage, which is especially important in field conditions at wells.

Thus, the technical result achieved by the proposed invention consists in increasing the effective impact radius of a downhole acoustic emitter on the bottomhole zone of oil wells due to an increase in acoustic power, radial directionality of acoustic radiation and a decrease in kilometric intensity attenuation of the acoustic wave in the surrounding space while increasing reliability and maintainability.

BRIEF DESCRIPTION OF THE DRAWINGS

FIG. 1 shows a longitudinal cross-section of the inventive downhole acoustic emitter.

DETAILED DESCRIPTION OF THE INVENTION

A downhole acoustic emitter contains an open support housing 1, with a cavity 2 and windows 3. A rod magnetostrictive transducer 4 with electric windings 5 on rods 6 is located within the cavity 2 of the housing 1. The downhole acoustic emitter also includes an acoustic waveguide 7, the upper end surface of which is coaxially connected to the lower radiating surface of the magnetostrictive transducer 4 by soldering. The acoustic waveguide 7 is made in the form of a cylinder, which passes into a decaying cone, while the cylindrical part of the acoustic waveguide 7 is located in the support housing 1 and the conical part is located outside the support housing 1. The lower end of the acoustic waveguide 7 is attached to the upper end of the radiating element 8 by a threaded connection 9. The radiating element 8 is made in the form of a cylinder or a prism with a square cross section. A standard geophysical end 10 of the brand NK-36 is installed in the support housing 1 to connect a borehole acoustic radiator with a power cable (not shown). The geophysical end 10 is connected by means of standard sealed contacts 11 to the electric windings 5 of the magnetostrictive transducer 4.

The electric windings 5 are made of thermo-resistant PTH wire with fluoroplastic insulation. The acoustic waveguide 7, in its middle part, coinciding with the zero point of its oscillation, is connected to the support housing 1 by a threaded connection 12. The upper end of the magnetostrictive transducer 4 is located in the cavity 2. The magnetostrictive transducer 4 is made of a Permendur and is 200-280 mm long. Two rows of windows 3 are located along the perimeter of the support housing 1, the first of which is at the upper turns of the electric windings 5 of the magnetostrictive transducer 4, and the second of which are at the level of its lower turns.

The device works as follows. From the ground based generator (not shown), the geophysical cable (not shown) through the geophysical head 10 is supplied with an alternating voltage of the operating frequency corresponding to the resonant frequency of the magnetostrictive transducer 4.8-12 kHz. At the same time, a constant bias (polarization) current is fed from the same generator to the same electric winding 5.6-8 nA. The rod magnetostrictive transducer 4 through the acoustic waveguide 7 transmits the energy of the acoustic wave to the radiating element 8, exciting in it the natural oscillations transmitted directly to the environment. When a downhole acoustic emitter is operated, due to the well-known effect of liquid degassing in the acoustic filed, the associated gas is released, which, accumulating in cavity 2, provides full reflection of oscillations from the upper radiating surface of the magnetostrictive transducer 4, which, in turn, doubles the amplitude oscillations of the lower end of the acoustic waveguide 7.

The invention claimed is:

1. A downhole acoustic emitter comprising:
a support housing with a cavity and windows;
a rod magnetostrictive transducer with an electric winding on rods, the rod magnetostrictive transducer being located within the cavity of the support housing;
an acoustic waveguide, an upper end surface of the acoustic waveguide is coaxially connected to a lower radiating surface of the rod magnetostrictive transducer by soldering, and the acoustic waveguide in a middle part, coinciding with a zero point of oscillation of the acoustic waveguide, is hermetically connected to the support housing, the acoustic waveguide has a cylindrical shape at an upper end and a lower end of the acoustic waveguide forms a decreasing cone and a cylindrical part of the acoustic waveguide is located in the support housing, and a conical part of the acoustic waveguide is located outside the support housing; and
a radiating element having an upper end connected to a lower end face of the acoustic waveguide by a threaded connection,
wherein the windows are located along a perimeter of the support housing in two rows, a first row is at a level of upper turns of the electric winding on the rods of the rod magnetostrictive transducer, and the second row is at a level of lower turns of the electric winding on the rods of the rod magnetostrictive transducer.

2. The downhole acoustic emitter according to claim 1, wherein a connection of the support housing with the acoustic waveguide is made in the form of a threaded connection.

3. The downhole acoustic emitter according to claim 1, wherein the radiating element is in a form of a cylinder or a prism with a square cross-section.

4. The downhole acoustic emitter according to claim 1, wherein the rod magnetostrictive transducer is from 200 mm to 280 mm long.

5. The downhole acoustic emitter according to claim 1, wherein the rod magnetostrictive transducer is made of a Permendur.

* * * * *